US009881995B2

(12) United States Patent
Kocon et al.

(10) Patent No.: US 9,881,995 B2
(45) Date of Patent: *Jan. 30, 2018

(54) MOSFET HAVING DUAL-GATE CELLS WITH AN INTEGRATED CHANNEL DIODE

(71) Applicant: Texas Instruments Incorporated, Dallas, TX (US)

(72) Inventors: Christopher Boguslaw Kocon, Mountain Top, PA (US); John Manning Savidge Neilson, Norristown, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/423,935

(22) Filed: Feb. 3, 2017

(65) Prior Publication Data

US 2017/0148871 A1   May 25, 2017

Related U.S. Application Data

(63) Continuation of application No. 15/075,310, filed on Mar. 21, 2016, now Pat. No. 9,601,612, which is a (Continued)

(51) Int. Cl.
*H01L 29/06* (2006.01)
*H01L 29/10* (2006.01)
(Continued)

(52) U.S. Cl.
CPC ............ *H01L 29/063* (2013.01); *H01L 23/50* (2013.01); *H01L 27/0629* (2013.01); *H01L 27/0727* (2013.01); *H01L 29/0634* (2013.01);
*H01L 29/1095* (2013.01); *H01L 29/404* (2013.01); *H01L 29/407* (2013.01);
(Continued)

(58) Field of Classification Search
CPC ............ H01L 29/7803; H01L 29/7804; H01L 29/063; H01L 29/407; H01L 23/50; H01L 27/0629; H01L 27/0727
See application file for complete search history.

(56) References Cited

U.S. PATENT DOCUMENTS 5,818,084 A    10/1998   Williams et al.
9,136,381 B1 *  9/2015   Kocon .................. H01L 29/783
(Continued)

*Primary Examiner* — Joseph C Nicely
(74) *Attorney, Agent, or Firm* — Rose Alyssa Keagy; Charles A. Brill; Frank D. Cimino

(57) ABSTRACT

A semiconductor device includes MOSFET cells having a drift region of a first conductivity type. A first and second active area trench are in the drift region. A split gate uses the active trenches as field plates or includes planar gates between the active trenches including a MOS gate electrode (MOS gate) and a diode gate electrode (diode gate). A body region of the second conductivity type in the drift region abuts the active trenches. A source of the first conductivity type in the body region includes a first source portion proximate to the MOS gate and a second source portion proximate to the diode gate. A vertical drift region uses the drift region below the body region to provide a drain. A connector shorts the diode gate to the second source portion to provide an integrated channel diode. The MOS gate is electrically isolated from the first source portion.

20 Claims, 9 Drawing Sheets

Related U.S. Application Data continuation of application No. 14/291,967, filed on May 30, 2014, now Pat. No. 9,324,856.

(51) Int. Cl.
*H01L 29/40* (2006.01)
*H01L 29/78* (2006.01)
*H01L 27/07* (2006.01)
*H01L 27/06* (2006.01)
*H01L 23/50* (2006.01)

(52) U.S. Cl.
CPC ........ *H01L 29/408* (2013.01); *H01L 29/7802* (2013.01); *H01L 29/7803* (2013.01); *H01L 29/7804* (2013.01); *H01L 29/7831* (2013.01)

(56) References Cited

U.S. PATENT DOCUMENTS

| | | |
|---|---|---|
| 9,318,598 B2 | 4/2016 | Grebs et al. |
| 9,324,856 B2 * | 4/2016 | Kocon ................ H01L 29/7804 |
| 9,484,450 B2 * | 11/2016 | Kocon ................ H01L 29/7804 |
| 9,601,612 B2 * | 3/2017 | Kocon ................ H01L 29/7804 |
| 2012/0211832 A1 * | 8/2012 | Chu ..................... H01L 29/402 |
| | | 257/335 |
| 2013/0193502 A1 | 8/2013 | Kocon et al. |
| 2013/0328122 A1 | 12/2013 | Li et al. |
| 2014/0097491 A1 | 4/2014 | Bulucea |
| 2014/0217497 A1 | 8/2014 | Kawahara et al. |
| 2014/0220761 A1 | 8/2014 | Molloy et al. |
| 2014/0349112 A1 | 11/2014 | Ishibashi et al. |
| 2015/0357459 A1 | 12/2015 | Kocon |
| 2016/0155809 A1 | 6/2016 | Tegen et al. |
| 2016/0197178 A1 | 7/2016 | Grebs et al. |
| 2016/0204249 A1 | 7/2016 | Kocon et al. |

\* cited by examiner

MOSFET HAVING DUAL-GATE CELLS WITH AN INTEGRATED CHANNEL DIODE

CROSS-REFERENCE TO RELATED APPLICATIONS

Under 35 U.S.C. §120, this continuation application claims priority to and benefits of U.S. patent application Ser. No. 15/075,310, filed on Mar. 21, 2016, which claims priority to and benefits of U.S. patent application Ser. No. 14/291,967, filed on May 30, 2014. The entirety of the above referenced applications are hereby incorporated by reference herein.

FIELD

Disclosed embodiments relate to metal-oxide-semiconductor field-effect transistors (MOSFETs) having electrically conductive filler material (e.g., polysilicon) filled trenches as field plates.

BACKGROUND

Some power MOSFETS designs include dielectric lined polysilicon filled trenches as their gates. In this power MOSFET structure, the gate is buried in a trench etched in the semiconductor, such as a substrate comprising silicon. This arrangement results in a vertical channel.

Other power MOSFETS designs use dielectric lined polysilicon filled trenches as field plates and provide a substantially planar FET structure, where the trench polysilicon is connected to the source (and generally also the body). For example, these MOSFETs have a gate structure and a vertical drain drift region between polysilicon filled trenches configured to act as field plates sometimes referred to as "RESURF trenches". For purposes of this patent application, the term "RESURF" is understood to refer to a material which reduces an electric field in an adjacent semiconductor region. A RESURF region may be for example a semiconductor region with an opposite conductivity type from the adjacent semiconductor region. RESURF structures are described in Appels, et. al., "Thin Layer High Voltage Devices" Philips J, Res. 35 1-13, 1980.

The RESURF trenches contain a dielectric liner and are generally filled with doped polysilicon. In the active region for n-MOSFET, the RESURF trenches (hereafter "active area trenches") are polysilicon field plates which are electrically coupled to the source electrode. In the case of an n-MOSFET, there is a p-body region within an n-drift region on a substrate, where n-type dopants are in the source regions formed in the p-body region. The drain for the n-MOSFET can be a vertical drain drift region that uses the entire n-drift region below the p-body region that has a drain contact on the bottom of the substrate, which can be an n+ substrate.

Related U.S. application Ser. No. 13/744,097 to Kocon et al. hereafter "the '097 application" where Kocon is one of the inventors of this application as well, discloses the MOS device described above having a substantially planar gate structure on a drift region of a first conductivity type and a body region of a second conductivity type formed in the drift region, having sources for n-MOSFETs formed in the body region. A vertical drain drift region is positioned between active area trenches.

A contact metal stack makes electrical contact with a source region for the MOSFET at lateral sides of the contact structure, makes electrical contact with a body contact region at a bottom surface of contact structure, and makes electrical contact to the polysilicon field plates in the active area trenches. Another RESURF trench which is referred to as a "termination trench" is at a perimeter around the active area trenches.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize a large percentage of power metal-oxide-semiconductor field-effect transistor (MOSFET) losses in power converter circuits are due to the switching loss caused by the presence of the inherent body diode (a PN junction) between the source and drain terminals, where the body region is shorted to the source. Such losses are present for both trench gate and planar gate MOSFET designs. The body diode is also recognized to induce circuit electromagnetic interference (EMI) and voltage spikes during operation that can be destructive to the MOSFET and the other power convertor circuit elements on the semiconductor device.

Disclosed embodiments relate to semiconductor devices including power MOSFETs including a plurality of MOSFET elemental cells (MOSFET cells) each having a planar (or lateral) split gate structure between active area trenches (RESURF trenches that function as field plates) including a first gate and a second gate, or a split trench gate, and a largely vertical drain drift region under the body region. One MOS gate is conventionally connected having separate contacts so that the gate, source and drain are electrically separated from its gate electrode which is referred to herein as a "MOS gate", while the other MOS gate has its gate electrode and source intentionally shorted (e.g., by metal or polysilicon) together with the body to provide a diode connected transistor referred to herein as an "integrated channel diode" having a gate electrode referred to as a "diode gate".

Although disclosed MOSFET cells are described as having a single MOS gate and a single diode gate, disclosed MOSFET cells can include more than one MOS gate and/or more than one diode gate. A disclosed integrated channel diode (which can also be termed a "pseudo-Schottky diode") functions as a rectifier diode in which when forward biased the forward current flows primarily through a thin layer or channel along the semiconductor surface of the device, rather than in the vertical direction through the bulk of the substrate.

As known in the art, a power MOSFET generally includes at least several hundred MOSFET cells electrically in parallel, typically several thousand MOSFET cells. Disclosed integrated channel diodes being MOSFET cells with its diode gates shorted to its source and body, blocks the flow of current which would otherwise drive its mobile carriers from the source to drain for, and allows current to freely flow in the direction for which carriers move (vertically).

A conventional silicon PN junction diode at room temperature has an offset (or turn-on) voltage of about 0.6 volts to 0.8 volts around room temperature before significant current begins to flow, because this is the voltage needed to overcome the built-in potential barrier of the junction. A disclosed integrated channel diode has a lower offset (or turn-on) voltage as compared to a conventional PN junction diode because the applied forward voltage being also applied to the diode gate acts as a gate bias which enhances the electrical conductivity of the channel region in the semiconductor surface under the diode gate, allowing carriers to flow through the channel without having to receive enough energy to "go over" the full height of the potential barrier. The lower offset voltage provided is advantageous because it results in less power loss, and more efficient operation for MOSFETs having disclosed integrated channel diodes as compared to conventional PN junction body diodes. Moreover, disclosed MOSFETs for power converter circuits reduce reverse recovery switching losses combined with lower EMI and peak voltage ringing compared to otherwise equivalent MOSFETs.

BRIEF DESCRIPTION OF THE DRAWINGS

Reference will now be made to the accompanying drawings, which are not necessarily drawn to scale, wherein.

DETAILED DESCRIPTION

Figure 1A:
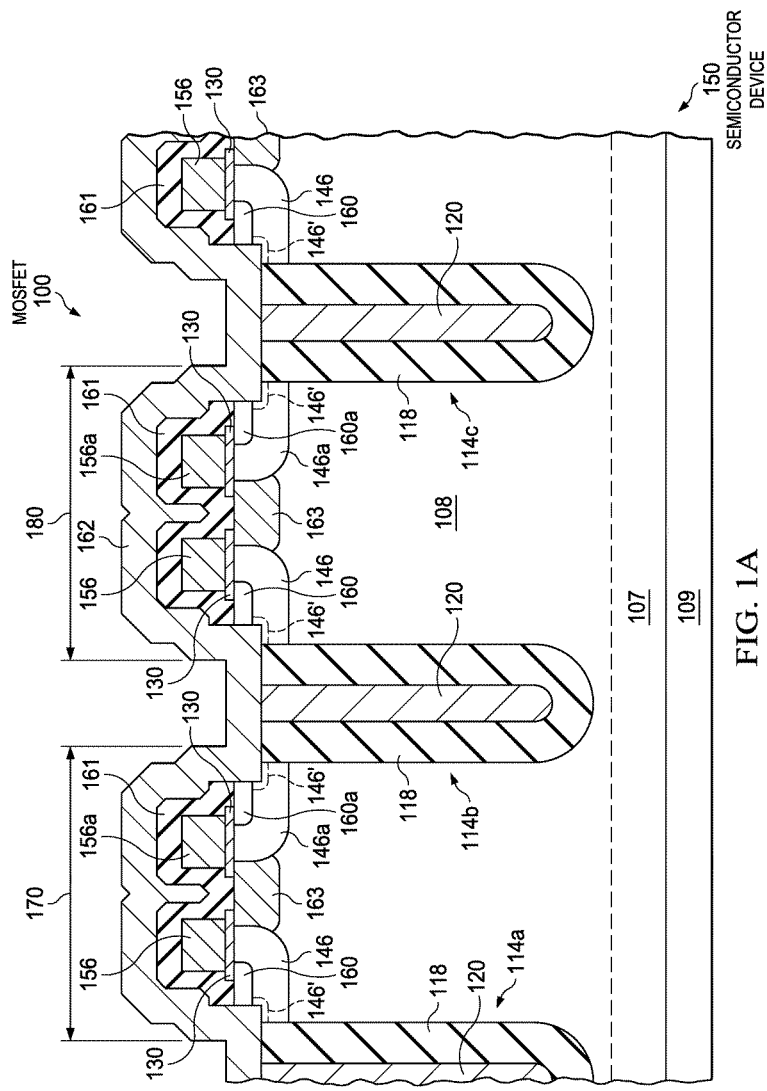
FIG. 1A is a cross sectional view of a semiconductor device including a portion of a disclosed MOSFET having split gate planar cells showing two n-channel MOSFET cells, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1A is a cross sectional view of an example semiconductor device 150 built on an n-semiconductor surface (n-drift region) 108 of a substrate 107 including a portion of an n-channel MOSFET 100 (MOSFET 100) showing two n-channel MOSFET split gate planar cells 170 and 180 with alternating MOS gate electrode stripes (shown in FIG. 1A and hereafter referred to as "MOS gates" 156) and diode gate electrode stripes (shown in FIG. 1A and hereafter referred to as "diode gates" 156*a*), according to an example embodiment. The MOS gates 156 are for one gate of the MOSFET cells having a conventional separate gate, source, and drain, with the source tied to the body, which operates as a 3-terminal MOSFET, and the other gate is a diode gate configured as an integrated channel diode cell having a gate, source and drain, with the gate, source and body shorted together to operate as 2-terminal integrated channel diode (see, e.g., FIG. 1B described below showing source metal shorting to the diode gates to the source and body and FIG. 3 described below showing a bus shorting the source to the diode gate and to the body). Although the MOSFETs described herein including MOSFET 100 are described as being n-channel MOSFETs, disclosed embodiments also include p-channel MOSFETs which can be achieved as known in the art by changing the semiconductor type dopings from p to n-type and from n to p type, with appropriate change in the doping levels.

MOSFET 100 includes n+ doped source regions shown as 160*a* for the diode gates 156*a* and n+ doped source regions 160 for the MOS gates 156. MOSFET 100 includes p-doped body regions 146 for MOS gates 156 and p-doped body regions 146*a* for the diode gates 156*a*. As described below, p-doped body regions 146 and p-doped body region 146*a* can be doped differently. The p-doped body regions 146 and 146*a* have a p+ contact 146'. As described below, the top metal shown as "source metal" 162 in FIG. 1A can be connected to the source regions 160*a* associated with the diode gates 156*a*, source regions 160 associated with the MOS gates 156, the diode gates 156*a*, and to the p-doped body 146 and p-doped body 146*a*.

N channel MOSFET cells 180 is shown including a split gate structure between active trench 114*b* and active trench 114*c*, an n-channel MOSFET cells 170 is shown including a split gate structure between active area trench (active trench) 114*a* and active trench 114*b*, where the diode gates 156*a* when connected by source metal 162 (not shown in FIG. 1A) becomes the anode region of the integrated channel diode. The n-semiconductor surface (n-drift region) 108 on the substrate 107 shown doped n+ is the common drain of the n-channel MOSFET cells 170 and 180, which becomes the cathode region of the integrated channel diode.

Disclosed integrated channel diodes have a significant advantage recognized herein in that they provide a faster recovery during the transition from forward conduction to reverse blocking as compared to a conventional PN junction. This occurs because the channel current for disclosed integrated channel diodes have only one kind of carrier, while the current across a conventional PN junction includes both kinds of carriers, both holes and electrons. After a PN junction diode has carried a forward current, the voltage-supporting region contains a mixture of both kinds of carriers, and cannot support a reverse voltage until enough time has passed for these excess carriers to recombine or to be removed by reverse current flow. This additional current during reverse recovery of the conventional PN junction diode is considered as power loss and a reason for circuit EMI noise and voltage oscillation. On the other side, forward current in the integrated channel diode is carried by only a single type of carrier, so the voltage-supporting region contains no excess carriers, and is essentially immediately ready to begin supporting reverse voltage when operated at a forward voltage below the PN junction barrier voltage.

The substrate 107 and/or n-drift region 108 more generally can comprise silicon, silicon-germanium, or other semiconductor material including III-V or II-VI materials. In one particular arrangement the n-drift region 108 is epitaxially oriented relative to the substrate 107, such as n-epitaxial layer on an n+ substrate for NMOS, or as p-epitaxial layer on a p+ substrate for PMOS embodiments. Another example is a silicon/germanium (SiGe) epitaxially grown on a silicon substrate.

Active trenches 114a-c are shown formed in the n-drift region 108 and lined by a trench dielectric liner 118. Active trenches 114a-114c also include an electrically conductive filler material 120 that generally comprises doped polysilicon, which function as RESURF trenches. A termination trench (not shown in FIG. 1A) generally sandwiches at least two sides of the plurality of active trenches as shown in FIG. 1C as 116 described below. High temperature tolerant electrically conductive filler materials other than polysilicon can also be used for the trenches, such as tungsten. In the case of doped polysilicon, the polysilicon is generally doped (e.g. n+ or p+), which can be doped in-situ with the polysilicon deposition, or deposited undoped and then ion implanted with one or more dopant ions. The active trenches 114a-c include a contact which allows the source metal 162, for example 2 µm to 5 µm of sputtered aluminum, to contact the electrically conductive filler material 120 at the top of the active trench. The source metal 162 can be replaced by other electrically conductive layers such as a polysilicon layer. The active trenches 114a-c can be 0.5 µm to 2 µm wide in one embodiment.

The trench dielectric liner 118 is a dielectric material which can comprise silicon oxide, or another dielectric material such as silicon nitride or silicon oxynitride, or a metal comprising high-k dielectric (k>5) material such as $HfO_2$. Although shown as a single layer, the trench dielectric liner 118 can comprise a relatively thin thermal silicon oxide layer (e.g., 50 to 100 nm) followed by a relative thick deposited dielectric layer (e.g., 200 nm to 400 nm of deposited silicon oxide).

A dielectric layer shown as an interlayer dielectric (ILD) layer 161 is shown over the top of the MOS gates 156 and diode gates 156a. In one embodiment the ILD layer 161 comprises a tetra-ethoxy-silane (TEOS) derived silicon oxide layer.

A planar split gate including MOS gate 156 and diode gate 156a is shown between active trenches for the MOSFET's cells, including MOSFET cell 180 that is between active trenches 114b and 114c. A p-doped body region 146 and p-doped region 146a are formed in the n-drift region 108, which as noted above can be epitaxial relative to the substrate 107. N-type dopants are in the source regions 160 and 160a formed in the p-doped body regions 146 and 146a. Although not shown, the respective gates can each include gate sidewall spacers. The gate dielectric layer is shown as 130. A patterned polysilicon layer can provide MOS gate 156 and diode gate 156a which are both over the gate dielectric layer 130.

N-type lightly doped drain (LDD) regions are shown as 163. The drain for MOSFET device 100 is a vertical drain drift region that uses the entire n-drift region 108 below the p-doped body region 146 (so that no reference number for the drain is shown in FIG. 1A), which has a drain contact (e.g. drain metal) 109 on the bottom side of the substrate 107, where substrate 107 can be an n+ substrate, such as an n+ silicon substrate. For p-channel MOSFET embodiments, substrate 107 can be a p+ substrate, such as a p+ silicon substrate.

The polysilicon layer when used for the MOS and diode gates 156, 156a may include 100 to 200 nanometers of polysilicon and possibly a layer of metal silicide (not shown) on the polysilicon, such as 100 to 200 nanometers of tungsten silicide. Other materials for the MOS and diode gates 156 and 156a are within the scope of this Disclosure.

Disclosed integrated channel diodes can be manufactured using the same threshold voltage ($V_T$) as the MOSFET cell portion by each having the same p-doped body region 146 doping. In this arrangement typically no changes are needed to the process flow, since shorting of diode gate to the source contact (and body contact) can be performed through a single contact mask layout change. However, in another embodiment, the performance of the integrated channel diode can be further improved in performance if the $V_T$ of the integrated channel diode is lowered in absolute value (lower for NMOS or made less negative for PMOS). The reason is that a lower threshold in absolute value results in the integrated channel diode having lower $V_f$ (forward voltage drop) due to being turned on at lower forward bias voltage. Also, the integrated channel diode will conduct more current than the conventional MOSFET cell portion, due to being lower Vf. An additional benefit as described above is lower reverse recovery due to most of current being MOS-gated diode current rather than parasitic MOSFET's body diode.

$V_T$ lowering for disclosed integrated channel diodes can be implemented by adjustment of body or source implant in the integrated channel diode area only. In one embodiment the p-doped body region 146 has a different doping level for the MOS transistor cell portion as compare to the integrated channel diode cell portion. For example, the p-body region for the MOS gate transistors for NMOS embodiments can be have a doping level of about 2 or $3\times10^{17}$ $cm^{-3}$, as compared to a lower doping level by at least a factor of 2, such as around $5\times10^{16}$ $cm^{-3}$ for the diode gate transistor to provide a lower $V_T$. For PMOS embodiments the n-body region for the MOS gate transistors can have a doping level of about $1\times10^{17}$ $cm^{-3}$ to $2\times10^{17}$ $cm^{-3}$, as compared to a lower doping level by at least a factor of 2, such as around $3\times10^{16}$ $cm^{-3}$ to $5\times10^{16}$ $cm^{-3}$ for the diode gate transistor to provide a lower $|V_T|$.

Figure 1B:
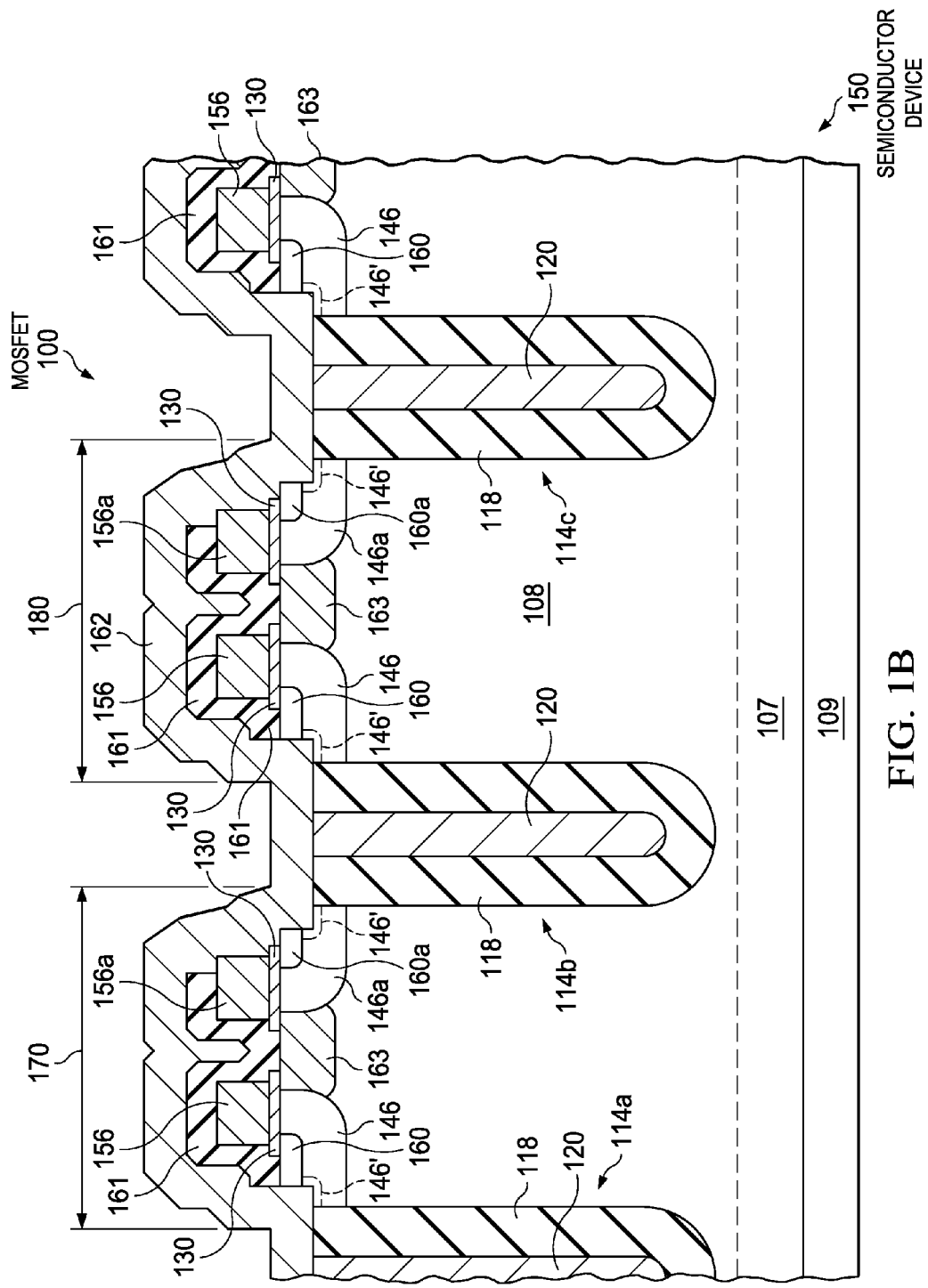
FIG. 1B is a cross sectional view of the semiconductor device shown in FIG. 1A along a cut where the diode gates of the cells contact the source metal along lengths of diode gate stripes, according to an example embodiment.
Figure 1C:
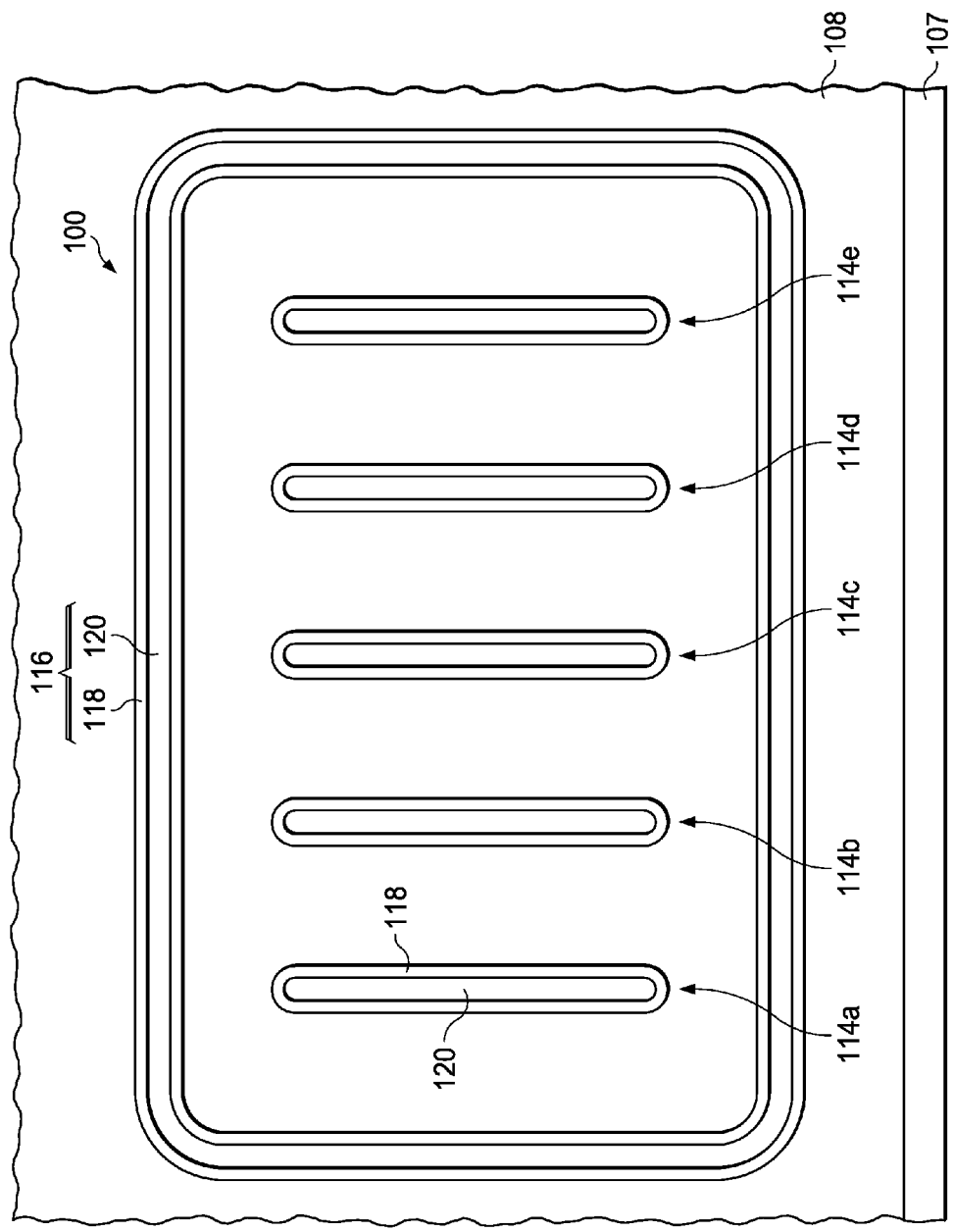
FIG. 1C is a top view of an example disclosed MOSFET showing a termination trench surrounding a plurality of active area trenches.

FIG. 1B is a cross sectional view of the semiconductor device 150 shown in FIG. 1A along a cut where the diode gates 156a of the cells of the MOSFET 100 contact the source metal 162 along lengths of diode gate stripes, according to an example embodiment. The ILD 161 can be seen to terminate on the top of the diode gates 156a to allow the source metal 162 to short to the diode gate 156a along the sidewall of the diode gate 156a to its source regions 160a and p-doped body region 146a.

FIG. 1C is a top view of the MOSFET 100 in FIGS. 1A and 1B modified to show a termination trench 116 surrounding a plurality of active trenches shown as active trenches 114a, 114b, 114c, 114d and 114e. Termination trench 116 includes trench dielectric liner 118 and electrically conductive filler material 120 therein. As noted above, although not shown in FIG. 1C, a planar split gate including a MOS gate 156 and a diode gate 156a is between adjacent active trenches for each of the MOSFET cells. The termination trench 116 can have the same width as the active trenches 114a, 114b, 114c, 114d and 114e. Although not shown, the termination trench 116 is generally electrically connected to at least one of the active trenches 114a, 114b, 114c, 114d and 114e, where the active trenches are electrically connected to a source region 160 or 160a (such as shown in FIG. 1A and FIG. 1B).

Figure 2:
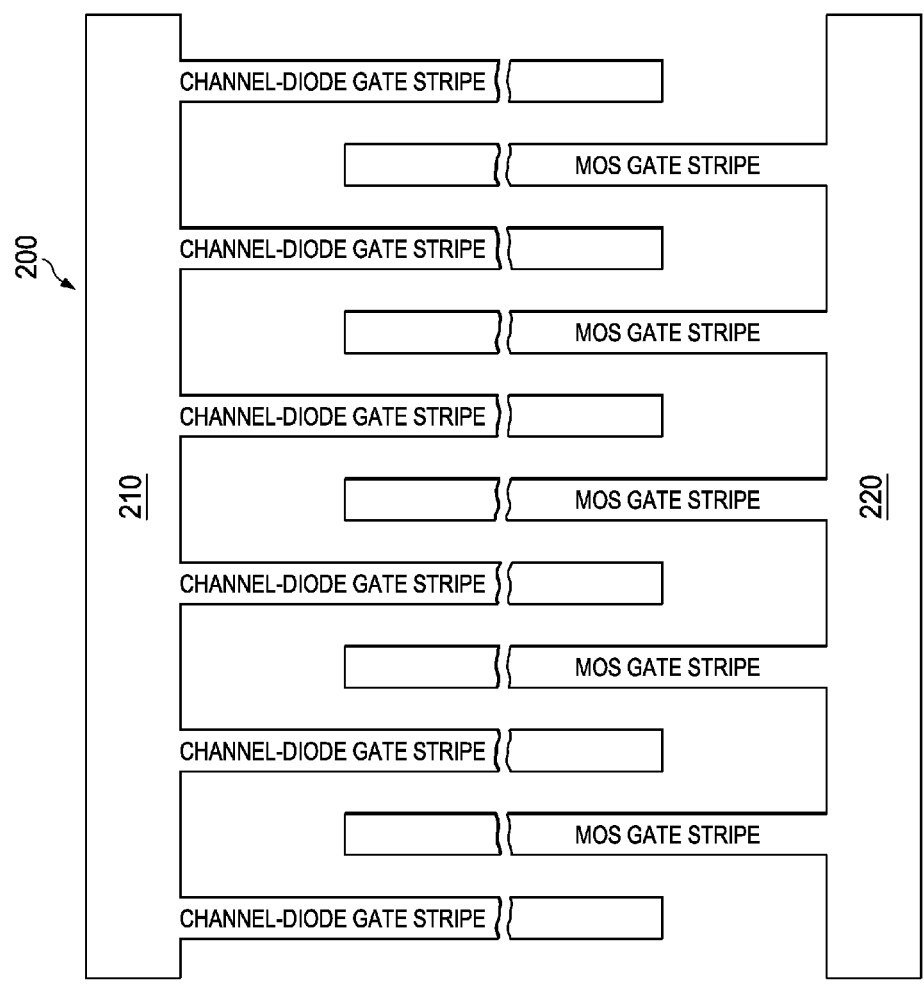
FIG. 2 is a top view depiction showing an example MOSFET having split gate planar cells including alternating (interdigitated) diode gate and MOS gate contacts for a split gate embodiment having including integrated channel diode stripes and MOS gate stripes, according to an example embodiment.

FIG. 2 is a top view depiction of an example MOSFET 200 (MOSFET 200) having split gate planar cells including alternating (interdigitated) diode gate and MOS gate contacts including integrated channel diode stripes and MOS gate stripes, according to an example embodiment. In this embodiment, on one end of the MOSFET 200 a first bus 210 that can comprise polysilicon, or metal (aluminum, copper or tungsten) ties (shorts) together all the source electrodes (and the bodies) to all of the diode gate stripes of the integrated channel diodes, while on the opposite end a second bus 220 that can also comprise polysilicon or metal ties (shorts) together all the MOS gate stripes. Although as shown in FIG. 2 all polysilicon gate stripes for both the diode gate stripes and the MOS gate stripes are each connected by common bus, in an alternate design there can be individual contacts to each stripe. Although shown as MOS gate stripes alternating with diode gate stripes, there can also be a smaller or larger percentage of diode gates relative to MOS gates by adjustment of the gate contact ratio between the first bus 210 and the second bus 220.

Figure 3:
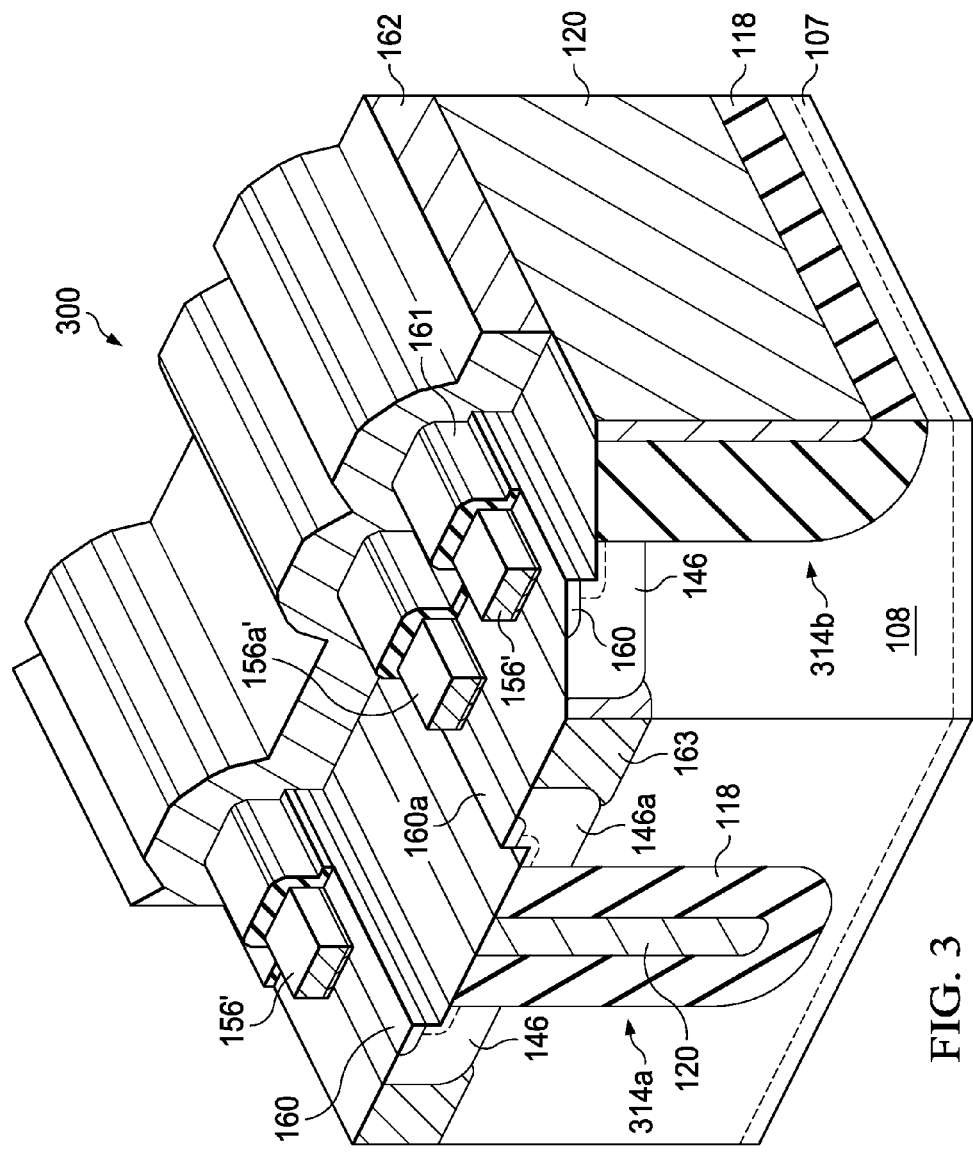
FIG. 3 is a perspective cross sectional view of an example MOSFET having split gate planar cells including active area trenches which are oriented in the same direction as the diode gate stripes and MOS gate stripes, according to an example embodiment.

FIG. 3 is a perspective cross sectional view of an example n-channel MOSFET 300 (MOSFET 300) having split gate planar cells including active trenches shown as 314a and 314b including a trench dielectric liner 118 (e.g., silicon oxide) and electrically conductive filler material 120 (e.g., polysilicon) which are oriented in the same direction as the diode gate stripes 156a' and MOS gate stripes 156', according to an example embodiment. The diode gate stripe 156a' and other diode gate stripes can all be shorted on one end to the source regions 160, 160a by the source metal 162 shown (which as noted above can also be shorted by other electrically conductive materials such as polysilicon). The MOS gate stripes 156' of respective cells can be shorted together on either end by metal or polysilicon.

Figure 4:
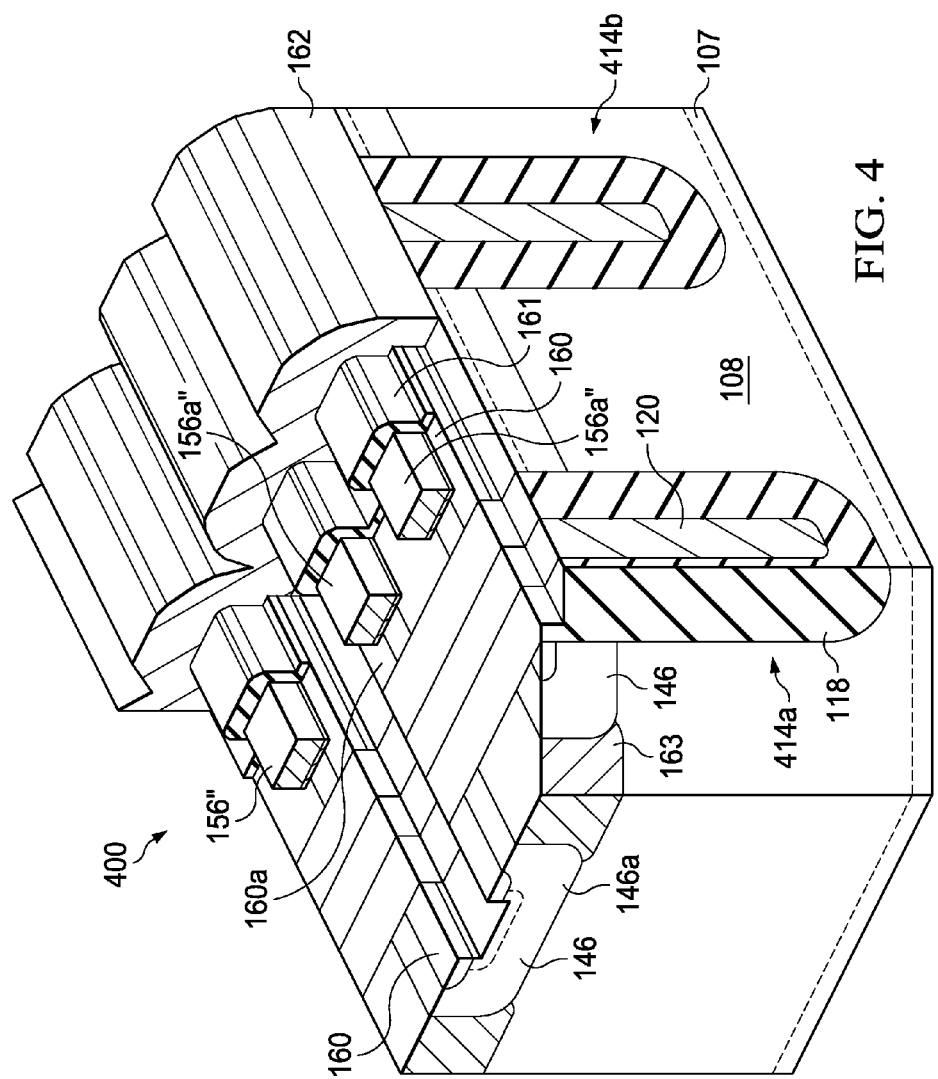
FIG. 4 is a perspective cross sectional view of an example MOSFET having split gate planar cells including active area trenches which are oriented 90° to a direction of the diode gate stripes and MOS gate stripes according to an example embodiment.

FIG. 4 is a perspective cross sectional view of an example MOSFET 400 (MOSFET 400) having split gate planar cells including active trenches shown as 414a and 414b including a trench dielectric liner 118 (e.g., silicon oxide) and electrically conductive filler material 120 (e.g., polysilicon) which are oriented 90° relative to a direction of the diode gate stripes 156a" and MOS gate stripes 156" according to an example embodiment. The diode gate stripe 156a" and other diode gate stripes can all be shorted to the source regions 160, 160a and the p-doped body regions 146, 146a by the source metal 162 shown.

Figure 5:
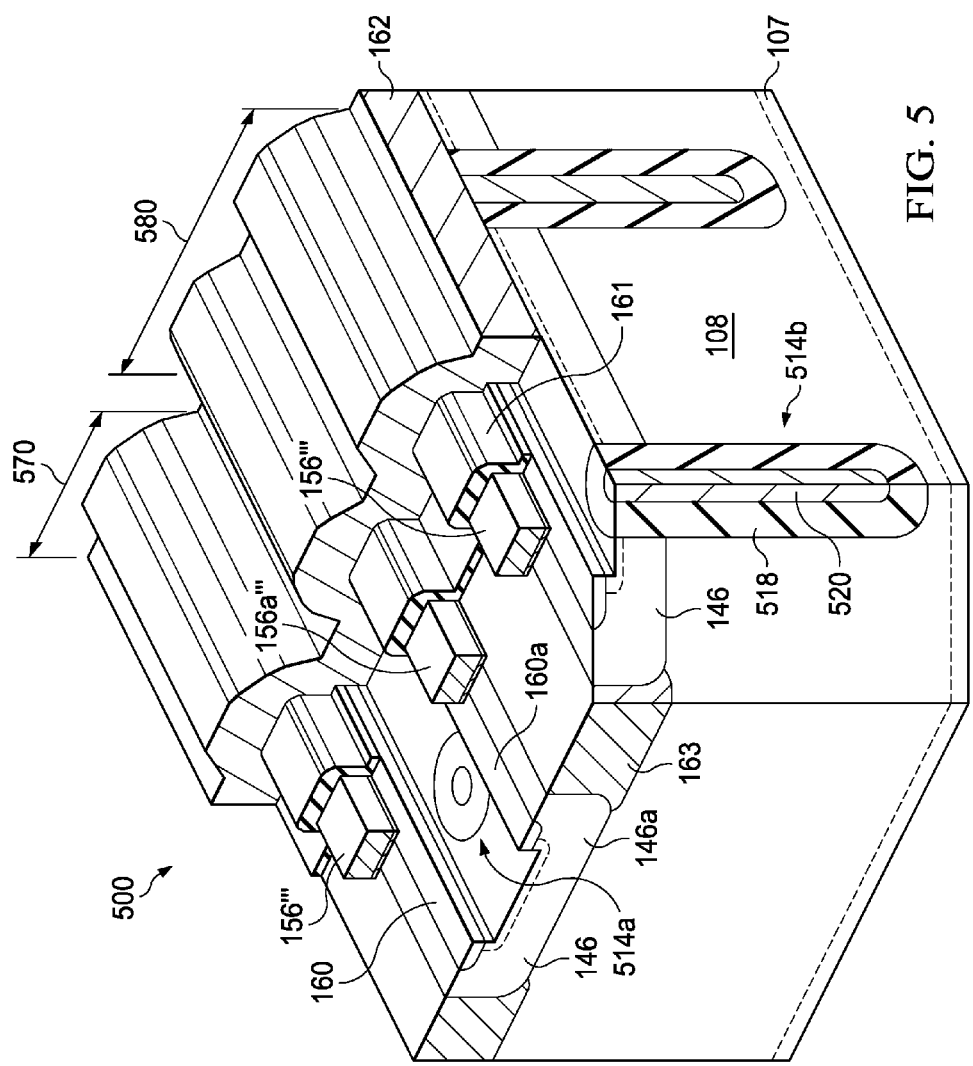
FIG. 5 is a perspective cross sectional view of an example MOSFET split gate planar cells including active area trench wells structures instead of active area trenches configured as stripes as disclosed above, according to an example embodiment.

FIG. 5 is a perspective cross sectional view of an example n-channel MOSFET 500 (MOSFET 500) having split gate planar cells including active trench wells 514a and 514b embodied as discrete polysilicon filled dielectric lined "well" structures instead of active trenches configured as stripes as disclosed above, according to an example embodiment. Analogous to the active trenches disclosed above, trench wells 514a and 514b include a dielectric liner 518 (e.g., silicon oxide) and electrically conductive filler material 520 (e.g., polysilicon). A diode gate stripe is shown as 156a''' and MOS gate stripes as 156'''. In this embodiment there are thus a plurality of active trench wells along the length between the diode gate stripe 156a''' of one MOSFET cell shown as 580 and the MOS gate stripe 156''' of an adjacent MOSFET cell shown as 570.

Figure 6:
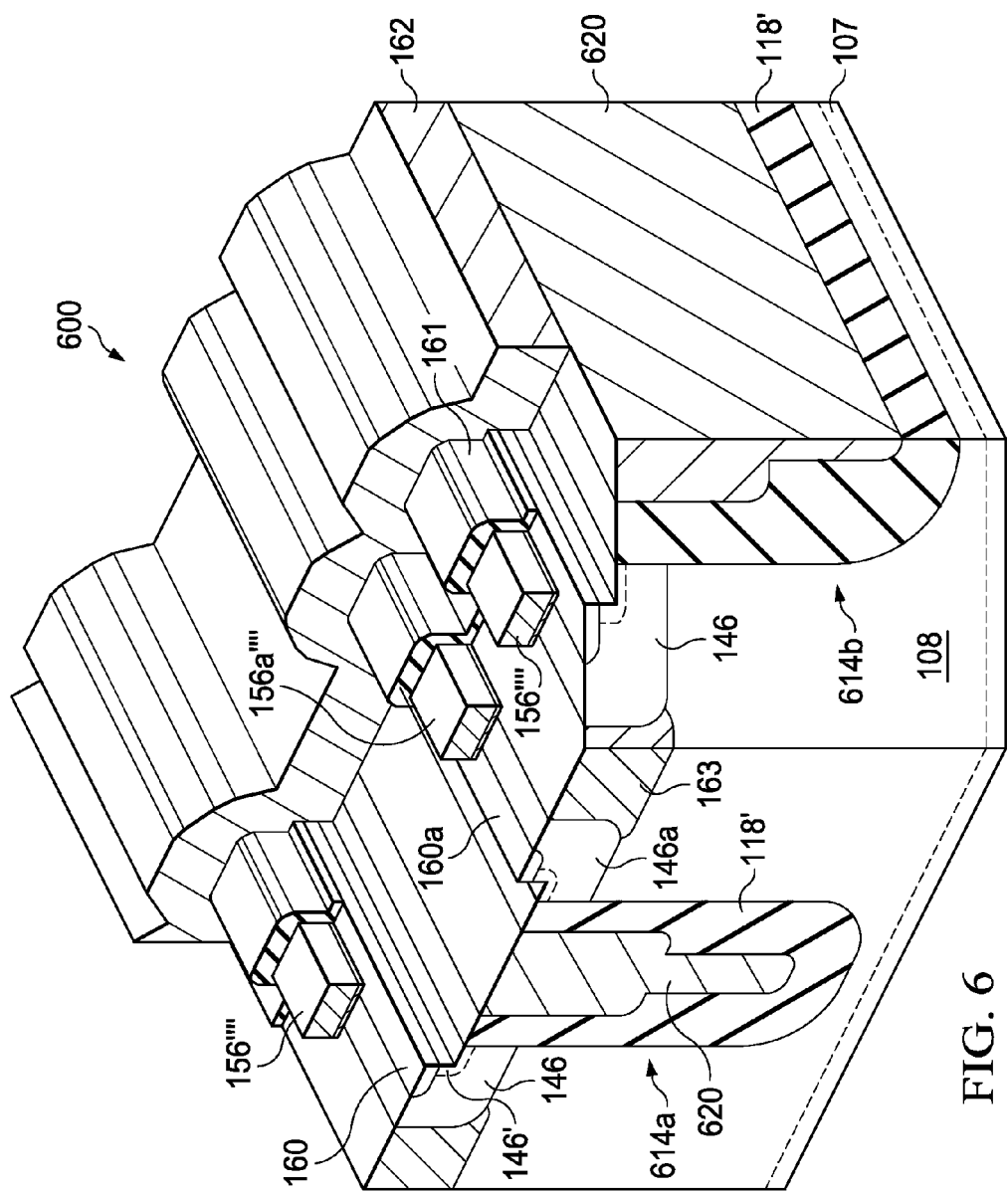
FIG. 6 is a perspective cross sectional view of an example MOSFET split gate planar cells including alternating MOS gate stripes and diode gate stripes, with contacts at the ends of the respective gate stripes, according to an example embodiment.

FIG. 6 is a perspective cross sectional view of an example MOSFET 600 (MOSFET 600) having split gate planar cells including alternating MOS gate stripes 156'''' and a diode gate stripe 156a'''', with gate contacts at the ends of the respective gate stripes, according to an example embodiment. MOSFET 600 also is shown including trenches 614a and 614b having a dual-width shield 620 configured with the electrically conductive filler material such as polysilicon providing a wider thicker surface portion and a reduced width portion below the wider thicker surface portion. Shield 620 is shown framed by a trench dielectric liner 118' (e.g., silicon oxide), with contacts to the shield 620 along the length of the trenches 614a and 614b.

Figure 7:
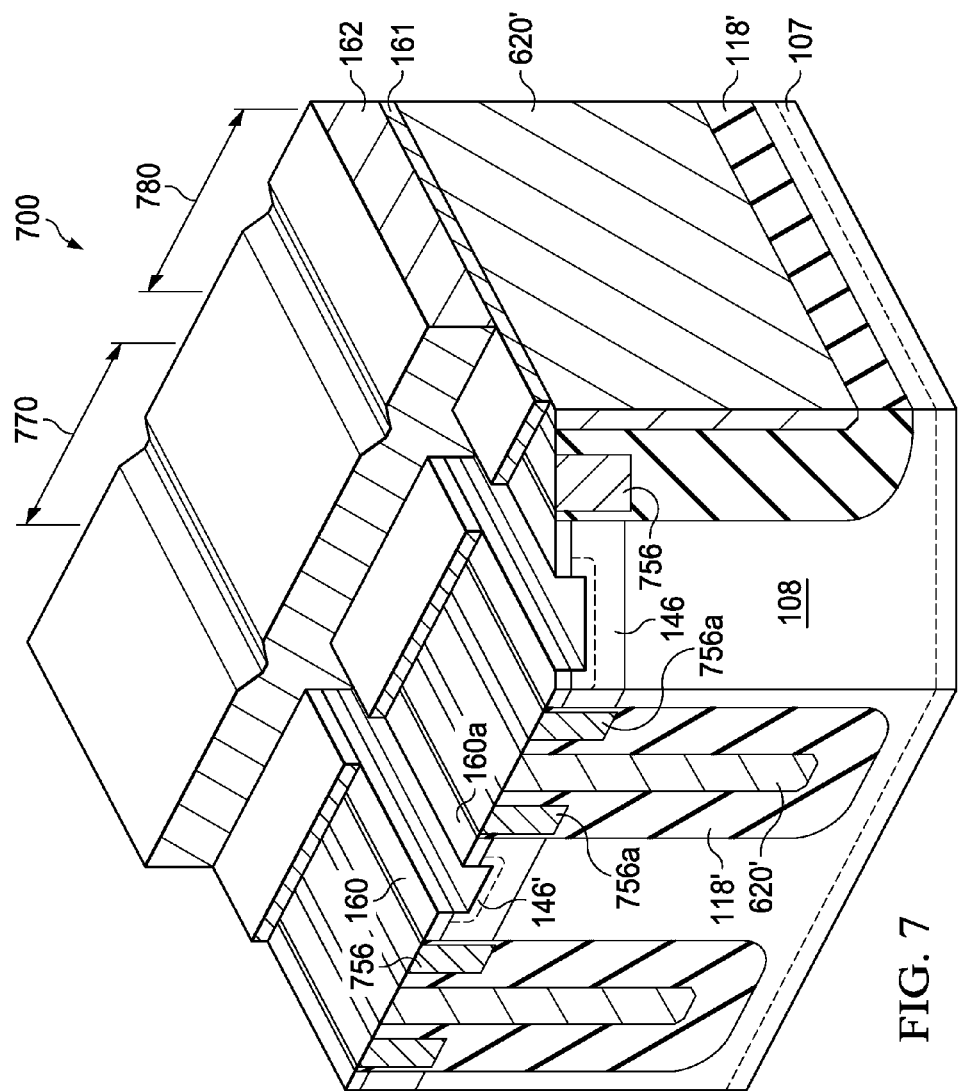
FIG. 7 is a perspective cross sectional view of an example MOSFET having split trench gate cells including alternating MOS gate stripes and diode gate stripes having a shield framed by a trench dielectric liner between the cells, according to an example embodiment.

FIG. 7 is a perspective cross sectional view of an example MOSFET 700 having split trench gate cells 770 and 780 including alternating MOS gate stripes 756 and diode gate stripes 756a having a shield 620' framed by a trench dielectric liner 118' (e.g., silicon oxide), between the cells, according to an example embodiment. In this MOSFET 700, the MOS gate stripes 756 and diode gate stripes 756a are buried in a trench etched in the n-semiconductor surface (n-drift region) 108 of the substrate 107. The source metal 162 shown provides contact to the diode gate stripes 756a, the p-body regions 146, and the source regions 160 and 160a. There are also contacts to the MOS gate stripes 756 and contacts to the shields 620' at their ends (not shown). The doping in p-body region 146 can be lower proximate to the diode gates as compared to proximate to the MOS gates as disclosed above for planar gate embodiments.

Numerous variations to disclosed embodiments beyond those disclosed above are possible. For example, the MOSFET 600 shown in FIG. 6 or MOSFET 700 shown in FIG. 7 can be modified to have localized contacts to the shields 620 or 620' instead of along the length of the shield stripe.

Disclosed process flows to implement disclosed MOSFETs provide ease of implementation with the ability to change a single contact mask change to enable formation of disclosed integrated channel diodes for one of the gates in the dual gate cells. For the embodiment described above having a lower Vt integrated channel diodes as compared to the MOS gates, the process will generally add another step to allow |Vth| lowering, such as by adjustment of a p-body (for NMOS) doping (e.g., implantation) or n-body doping (e.g., implantation) for PMOS, or a source implant in the integrated channel diode area only.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS. The semiconductor die can also be a discrete die.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

What is claimed is:

1. A transistor, comprising:
   a first doped region having a first conductivity type;
   a second doped region having a second conductivity type opposite to the first conductivity type, the second doped region above the first doped region;
   a third doped region having the first conductivity type and separated from the first doped region by the second doped region;
   a fourth doped region having the first conductivity type and separated from the first doped region and the third doped region by the second doped region;
   a first gate electrode insulated from the third doped region; and
   a second gate electrode insulated from the first gate electrode and coupled to the fourth doped region.

2. The transistor of claim 1, further comprising:
   a first trench positioned adjacent to the third doped region and extending to the first doped region; and
   a second trench positioned adjacent to the fourth doped region and extending to the first doped region, the second trench opposing the first trench with the third and fourth doped regions positioned therebetween.

3. The transistor of claim 2, wherein:
   the first trench includes: a first dielectric liner lining a first inner surface of the first trench, and a first conductor deposited on the first dielectric liner and coupled to the third doped region; and
   the second trench includes: a second dielectric liner lining a second inner surface of the second trench, and a second conductor deposited on the second dielectric liner and coupled to the fourth doped region and the second gate electrode.

4. The transistor of claim 1, further comprising:
   a conductive layer contacting the third and fourth doped regions; and
   a dielectric layer insulating the first gate electrode from the conductive layer and partially exposing the second gate electrode to the conductive layer.

5. The transistor of claim 4, further comprising:
   a first trench field plate positioned adjacent to the third doped region and extending to the first doped region, the first trench field plate contacting the conductive layer; and
   a second trench field plate positioned adjacent to the fourth doped region and extending to the first doped region, the second trench field plate coupled to the second gate electrode by contacting the conductive layer.

6. The transistor of claim 5, wherein:
   the first gate electrode is positioned between the first trench field plate and the third doped region; and
   the second gate electrode is positioned between the second trench field plate and the fourth doped region.

7. The transistor of claim 4, wherein the first gate electrode is positioned above the third doped region, and the second gate electrode is positioned above the fourth doped region.

8. The transistor of claim 4, wherein the conductive layer includes a metal layer or a polysilicon layer, or a combination thereof.

9. The transistor of claim 1, further comprising:
   a lightly doped region having the first conductivity type, and positioned between the third and fourth doped regions and above the first doped region, the lightly doped region having a lower doping concentration than the first doped region.

10. The transistor of claim 1, wherein the first conductivity type includes an n-type, and the second conductivity type includes a p-type.

11. An integrated circuit, comprising:
    transistor cells each having:
      a first doped region having a first conductivity type;
      a second doped region having a second conductivity type opposite to the first conductivity type, the second doped region above the first doped region;
      a third doped region having the first conductivity type and separated from the first doped region by the second doped region;
      a fourth doped region having the first conductivity type and separated from the first doped region and the third doped region by the second doped region;
      a first gate electrode insulated from the third doped region; and
      a second gate electrode insulated from the first gate electrode and coupled to the fourth doped region
    a first bus coupled to the first gate electrode of each of the transistor cells; and
    a second bus coupled to the second gate electrode of each of the transistor cells.

12. The integrated circuit of claim 11, wherein each of the transistor cells includes:
    a conductive layer contacting the third and fourth doped regions; and
    a dielectric layer insulating the first gate electrode from the conductive layer and partially exposing the second gate electrode to the conductive layer.

13. The integrated circuit of claim 12, wherein each of the transistor cells includes:
    a first trench field plate positioned adjacent to the third doped region and extending to the first doped region, the first trench field plate contacting the conductive layer; and
    a second trench field plate positioned adjacent to the fourth doped region and extending to the first doped region, the second trench field plate coupled to the second gate electrode by contacting the conductive layer.

14. The integrated circuit of claim 11, wherein each of the transistor cells includes:
    a lightly doped region having the first conductivity type, and positioned between the third and fourth doped regions and above the first doped region, the lightly doped region having a lower doping concentration than the first doped region.

15. The integrated circuit of claim 11, wherein the first conductivity type includes an n-type, and the second conductivity type includes a p-type.

16. An integrated circuit, comprising:
    transistor cells each having:
      a first doped region having a first conductivity type;
      a second doped region having a second conductivity type opposite to the first conductivity type, the second doped region above the first doped region;

a third doped region having the first conductivity type and separated from the first doped region by the second doped region;
a fourth doped region having the first conductivity type and separated from the first doped region and the third doped region by the second doped region;
a first trench gate electrode insulated from the third doped region; and
a second trench gate electrode insulated from the first trench gate electrode and coupled to the fourth doped region;
a first trench field plate positioned between the first trench gate electrodes of the transistor cells positioned adjacent to each other; and
a second trench field plate positioned between the second trench gate electrodes of the transistor cells positioned adjacent to each other.

17. The integrated circuit of claim 16, further comprising:
a first trench housing the first trench field plate and at least one of the first trench gate electrodes, the first trench including a first dielectric liner insulating the first trench field plate from the at least one of the first trench gate electrodes; and
a second trench housing the second trench field plate and at least one of the second trench gate electrodes, the second trench including a second dielectric liner insulating the second trench field plate from the at least one of the second trench gate electrodes.

18. The integrated circuit of claim 16, wherein each of the transistor cells includes:
a conductive layer contacting the third and fourth doped regions; and
a dielectric layer insulating the first trench gate electrode from the conductive layer and partially exposing the second trench gate electrode to the conductive layer.

19. The integrated circuit of claim 16, wherein:
each of the first and second trench field plates extends from adjacent to the third and fourth doped regions respectively and penetrates the first doped region; and
each of the first and second trench gate electrodes extends from adjacent to the third and fourth doped regions respectively and terminates before substantially entering the first doped region.

20. The integrated circuit of claim 16, wherein the first conductivity type includes an n-type, and the second conductivity type includes a p-type.

* * * * *